(12) United States Patent
Janakiraman et al.

(10) Patent No.: US 10,236,197 B2
(45) Date of Patent: Mar. 19, 2019

(54) PROCESSING SYSTEM CONTAINING AN ISOLATION REGION SEPARATING A DEPOSITION CHAMBER FROM A TREATMENT CHAMBER

(71) Applicant: Applied Materials, Inc., Santa Clara, CA (US)

(72) Inventors: Karthik Janakiraman, San Jose, CA (US); Abhijit Basu Mallick, Fremont, CA (US); Hari K. Ponnekanti, San Jose, CA (US); Mandyam Sriram, San Jose, CA (US); Alexandros T. Demos, Fremont, CA (US); Mukund Srinivasan, Fremont, CA (US); Juan Carlos Rocha-Alvarez, San Carlos, CA (US); Dale R. Dubois, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 42 days.

(21) Appl. No.: 14/589,990

(22) Filed: Jan. 5, 2015

(65) Prior Publication Data

US 2016/0133489 A1 May 12, 2016

Related U.S. Application Data

(60) Provisional application No. 62/076,292, filed on Nov. 6, 2014.

(51) Int. Cl.
*H01L 21/67* (2006.01)
*C23C 16/458* (2006.01)
*H01L 21/687* (2006.01)
*C23C 14/58* (2006.01)
*C23C 14/50* (2006.01)
*B05C 13/00* (2006.01)
*C23C 16/56* (2006.01)
*H01L 21/677* (2006.01)

(52) U.S. Cl.
CPC .... *H01L 21/67207* (2013.01); *H01L 21/6719* (2013.01); *H01L 21/6776* (2013.01); *H01L 21/67126* (2013.01); *H01L 21/67213* (2013.01); *H01L 21/67709* (2013.01)

(58) Field of Classification Search
CPC ................................................ H01L 21/67201
See application file for complete search history.

(56) References Cited

U.S. PATENT DOCUMENTS

2003/0219977 A1* 11/2003 Pomarede ......... H01L 21/67017
                                                          438/680
2004/0058293 A1   3/2004 Nguyen et al.
(Continued)

*Primary Examiner* — Parviz Hassanzadeh
*Assistant Examiner* — Nathan K Ford
(74) *Attorney, Agent, or Firm* — Patterson+Sheridan LLP

(57) ABSTRACT

An apparatus and method for processing a substrate in a processing system containing a deposition chamber, a treatment chamber, and an isolation region, separating the deposition chamber from the treatment is described herein. The deposition chamber deposits a film on a substrate. The treatment chamber receives the substrate from the deposition chamber and alters the film deposited in the deposition chamber with a film property altering device. Processing systems and methods are provided in accordance with the above embodiment and other embodiments.

20 Claims, 15 Drawing Sheets

(56) References Cited

U.S. PATENT DOCUMENTS

| | | | |
|---|---|---|---|
| 2006/0102078 A1* | 5/2006 | Fairbairn | H01L 21/67161 118/719 |
| 2010/0062592 A1* | 3/2010 | Clark | H01L 21/28176 438/591 |
| 2010/0136773 A1* | 6/2010 | Akae | C23C 16/4408 438/507 |
| 2013/0171757 A1* | 7/2013 | Ponnekanti | H01L 31/18 438/57 |

* cited by examiner

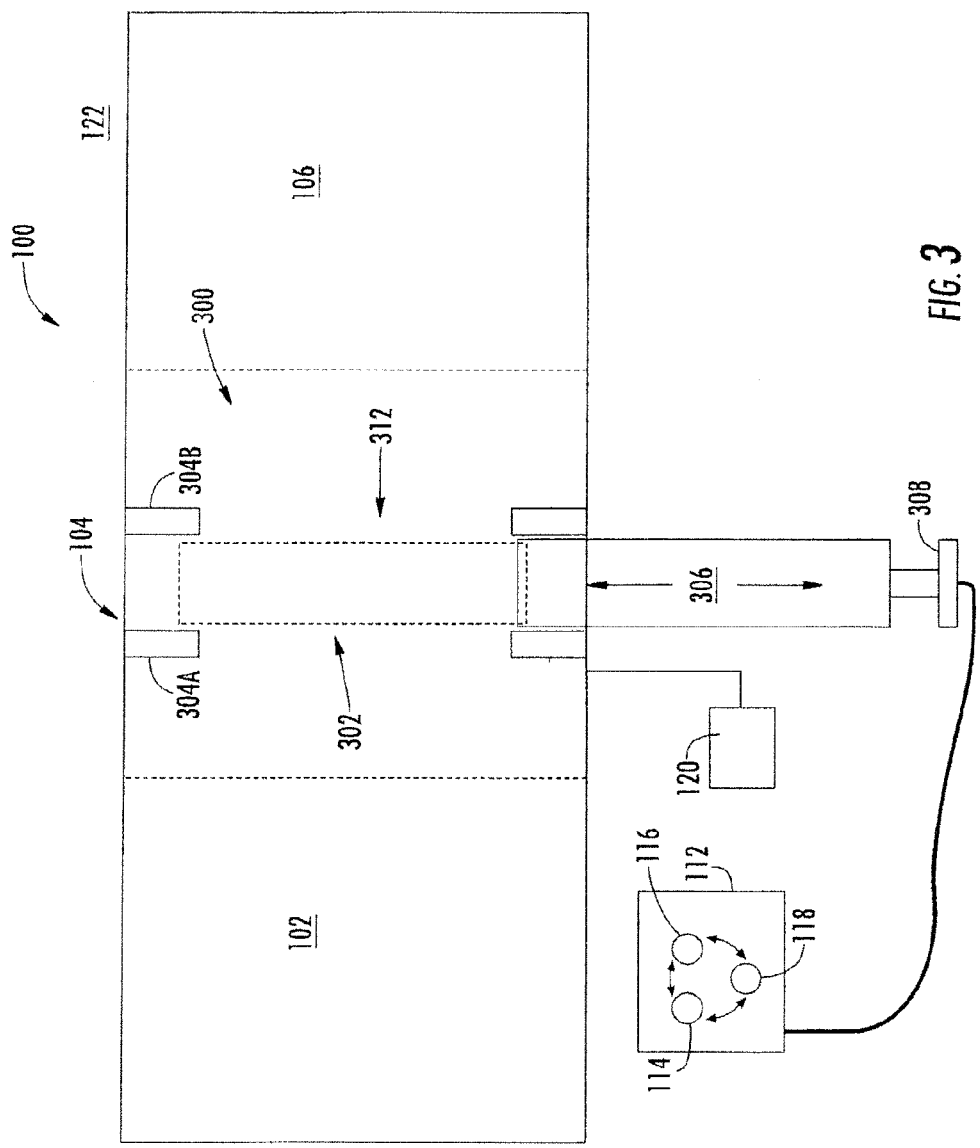

PROCESSING SYSTEM CONTAINING AN ISOLATION REGION SEPARATING A DEPOSITION CHAMBER FROM A TREATMENT CHAMBER

CROSS-REFERENCE TO RELATED APPLICATIONS

This application claims priority from U.S. Provisional Application Ser. No. 62/076,292, filed Nov. 6, 2014, which is hereby incorporated by reference in its entirety.

BACKGROUND

Field

The invention generally relates to a processing system including an isolation region that separates a deposition chamber from a treatment chamber.

Description of the Related Art

In semiconductor manufacturing, next generation chemical vapor deposition (CVD) films will likely require a treatment process following the film deposition process in order to obtain desired film properties. Additionally, the treatment process may need to be performed shortly after the film deposition process in order to avoid native oxide formation.

Existing architectures for semiconductor processing systems are not designed for rapid sequential deposition and treatment processes. Moreover, conventional processing systems are large and take up significant and valuable floor space in cleanroom environments. Thus, increasing the size of conventional semiconductor processing systems to accommodate more rapid transfer of substrates from a deposition chamber to a treatment chamber is not an acceptable solution.

Thus, there is a need for an improved semiconductor processing system suitable for sequential deposition and processing.

SUMMARY

A processing system including a deposition chamber, a treatment chamber, and at least one isolation region is disclosed herein. The deposition chamber is configured to deposit a film on the substrate. The treatment chamber is arranged to receive substrates from the deposition chamber. The treatment chamber passes the substrates away from the deposition chamber. The treatment chamber includes a film property altering device. The film property altering device is operable to treat the substrate disposed in the treatment chamber. The film property altering device alters the property of the film deposited in the deposition chamber. The isolation region is configured to separate the deposition chamber from the treatment chamber.

In another embodiment, a method for processing a substrate in a processing system is described herein. The method includes transferring the substrate into the first deposition chamber. A film is deposited on the substrate while in the first deposition chamber. The substrate is transferred through a first isolation region separating the deposition chamber from a first treatment chamber. The property of the deposited film is altered in the first treatment chamber.

In another embodiment, a processing system including a deposition chamber, a treatment chamber, at least one isolation region, and a transfer mechanism is described herein. The deposition chamber is configured to deposit a film on a substrate. The deposition chamber includes a substrate support. The substrate support is configured to support the substrate in an interior volume of the deposition chamber. The treatment chamber is in-line with the deposition chamber. The treatment chamber includes a substrate support and a film property altering device. The substrate support is configured to support a substrate in an interior volume of the treatment chamber for processing. The film property altering device is operable to treat the substrate disposed in the treatment chamber. The film property altering device alters the property of a film deposited on the substrate in the deposition chamber. The film property altering device is disposed in the interior volume of the treatment chamber. The film property altering device is substantially parallel to and above the top surface of the substrate support in the interior volume. The at least one isolation region is configured to separate the deposition chamber from the treatment chamber. The transfer mechanism is configured to transfer a substrate from the deposition chamber, through the isolation region, and into the treatment chamber. The deposition chamber, treatment chamber, isolation region, and transfer mechanism reside in a vacuum tight processing system.

BRIEF DESCRIPTION OF THE DRAWINGS

The accompanying drawings, which are incorporated in and constitute a part of the specification, schematically illustrate the present invention and, together with the general description given above and the detailed description given below, serve to explain the principles of the invention.

FIG. 3 illustrates another embodiment of an isolation region, where the isolation region is a slit valve;

For clarity, identical reference numerals have been used, where applicable, to designate identical elements that are common between figures.

DETAILED DESCRIPTION

Figure 1:
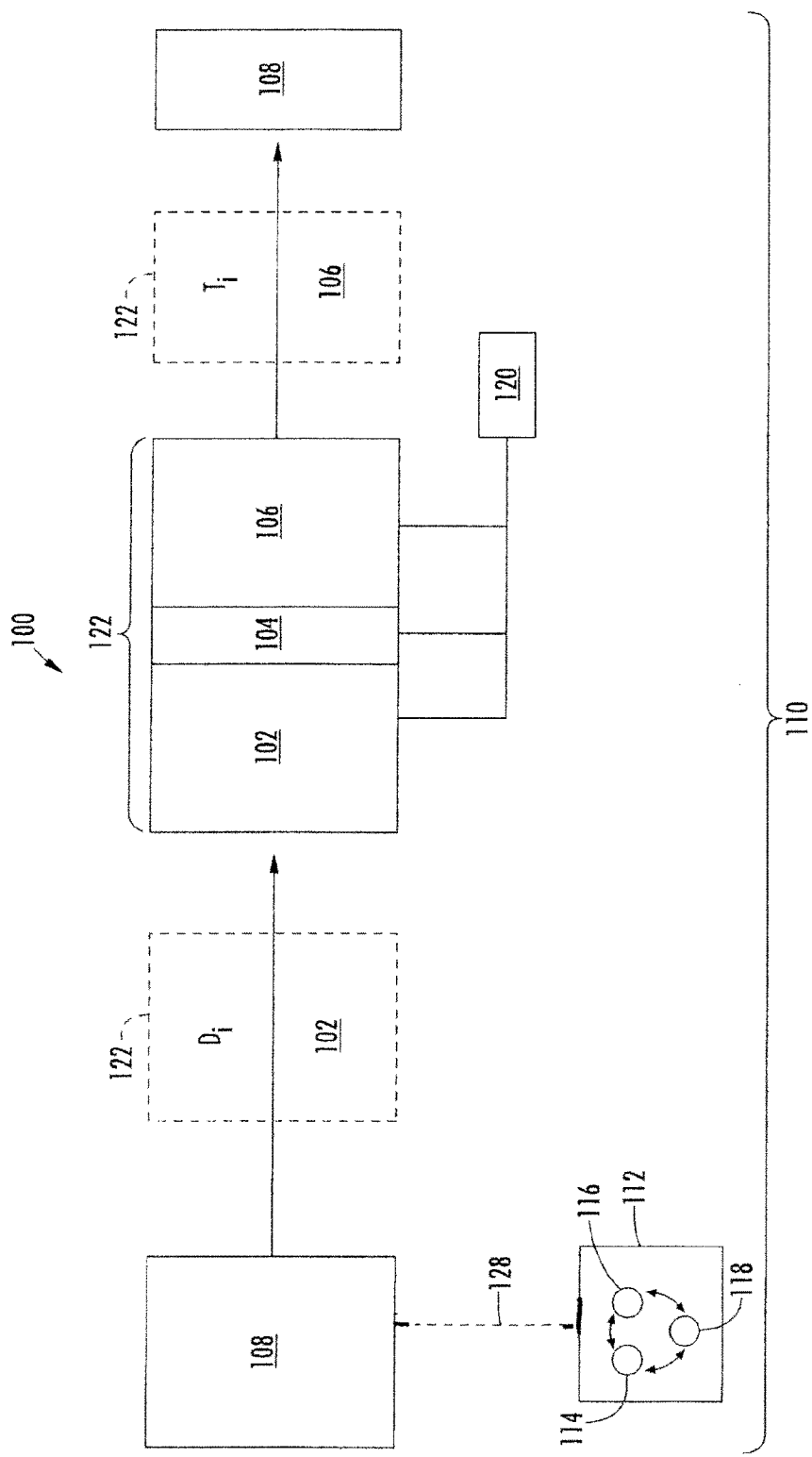
FIG. 1 schematically illustrates a layout for an inline processing system.

FIG. 1 schematically illustrates a sequential processing system 100 suitable for sequentially depositing and treating a film on a substrate within the processing system 100. The processing system 100 includes a process station 122, an isolation region 104, and a load lock station 108. The process station 122, the isolation region 104, and the load lock station 108 are connected to form a continuous vacuum tight platform 110.

A pump system 120 is coupled to the load lock station 108, the process station 122, and the isolation region 104. The pump system 120 controls the pressure within the processing system 100. The pump system 120 may be utilized to pump down and vent the load lock station 108 as needed to facilitate entry and removal of substrates from the vacuum tight platform 110.

The process station 122 includes at least one deposition region 102 and at least one treatment region 106. At least one of the one or more treatment regions 106 is sequentially downstream (i.e., relative to the direction of process flow through the processing system 100) from at least one of the deposition regions 102. For example, the treatment region 106 may be sequentially downstream of the last of several deposition regions 102 (illustrated as $D_i$ in FIG. 1). The isolation region 104 is utilized to prevent, or at least substantially minimize, the flow of gases between the regions 102, 106.

The processing system 100 is coupled to a controller 112 by a communication cable 128. The controller 112 is operable to control processing of a substrate (not shown) within the processing system 100. The controller 112 includes a programmable central processing unit (CPU) 116 that is operable with a memory 114 and a mass storage device, an input control unit, and a display unit (not shown), such as power supplies, clocks, cache, input/output (I/O) circuits, and the like, coupled to the various components of the processing system 100 to facilitate control of the processes of processing a substrate. The controller 112 may also include hardware for monitoring the processing of a substrate through sensors (not shown) in the processing system 100.

To facilitate control of the processing system 100 and processing a substrate, the CPU 116 may be one of any form of general purpose computer processors for controlling the substrate process. The memory 114 is coupled to the CPU 116 and the memory 114 is non-transitory and may be one or more of readily available memory such as random access memory (RAM), read only memory (ROM), floppy disk drive, hard disk, or any other form of digital storage, local or remote. Support circuits 118 are coupled to the CPU 116 for supporting the CPU 116 in a conventional manner. The process for processing a substrate is generally stored in the memory 114. The process for processing a substrate may also be stored and/or executed by a second CPU (not shown) that is remotely located from the hardware being controlled by the CPU 116.

The memory 114 is in the form of computer-readable storage media that contains instructions, that when executed by the CPU 116, facilitates the operation of processing a substrate in the processing system 100. The instructions in the memory 114 are in the form of a program product such as a program that implements the operation of processing a substrate. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

A motion mechanism (not shown in FIG. 1) is provided to transfer substrates through each respective deposition region 102 and treatment region 106 of the process station 122 that are separated by the isolation region 104. The substrate may leave the processing system 100 through another load lock station 108 connected downstream of the last treatment region 106 of the processing system 100. The substrate processed therein is not exposed to the substantially ambient (e.g., atmospheric) environment outside the processing system 100 in which the substrate may oxidize, because the load lock station 108, process station 122, and isolation region 104 are interconnected to form a vacuum tight platform 110.

Figure 2:
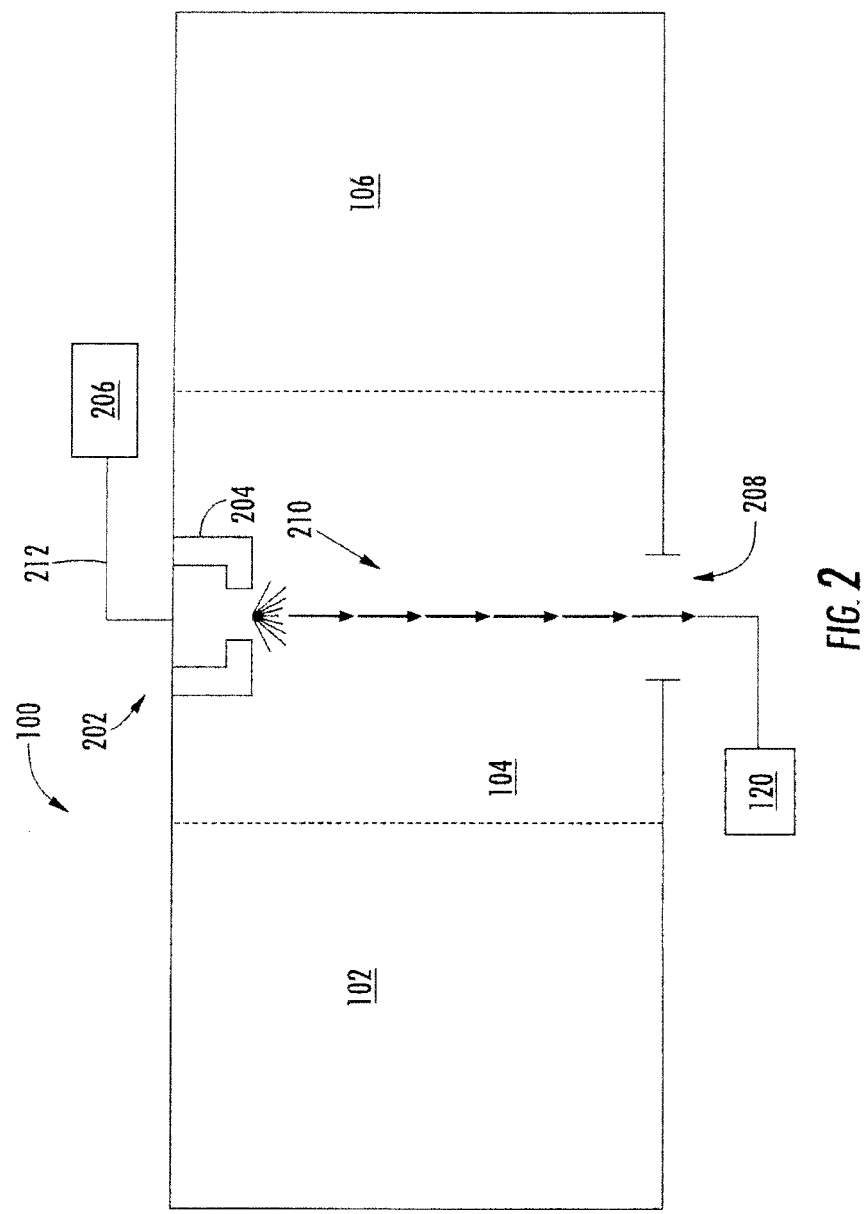
FIG. 2 illustrates one embodiment of an isolation region, where the isolation region is a gas curtain.

FIG. 2 is an illustration of one embodiment of the isolation region 104 configured as a gas curtain 202. The gas curtain 202 separates any two adjacent deposition and treatment regions 102, 106 of the process station 122 of the processing system 100. In the configuration depicted in FIG. 2, the process station 122 is a single processing chamber having the deposition and treatment regions 102, 106 defined therein as part of a single contiguously interior volume of the processing chamber. For example, the gas curtain 202 provides a flow of process inert gases that separates the deposition region 102 from the treatment region 106. The gas curtain 202 includes at least one nozzle 204 disposed in the isolation region 104. The nozzle 204 may be aligned with an exhaust port 208. A gas source 206 is coupled to nozzle 204 through a conduit 212. Process inert gases, such as nitrogen among other gases, may be provided from the nozzle 204 to produce a vertical gas curtain 210 of inert gas. The vertical gas curtain 210 isolates the gases used in the deposition region 102 from gases used in the treatment region 106. The gases provided by the gas curtain 210 may flow out of the isolation region 104 through an exhaust port 208 formed in the bottom of the isolation region 104. The exhaust port 208 may be coupled to a facilities exhaust (not shown).

The gas curtain 202 allows a substrate (not shown) to move seamlessly from deposition region 102 to the treatment region 106 utilizing a motion mechanism, future (described below). While allowing two adjacent deposition and treatment regions 102, 106 to be connected through the gas curtain 210, cross contamination between adjacent regions 102, 106 is reduced or substantially eliminated while allowing rapid transfer between the regions 102, 106.

FIG. 3 provides another embodiment of the isolation region 104 configured as a slit valve assembly 300. In the configuration depicted in FIG. 3, the deposition and treatment regions 102, 106 of the process station 122 are defined as two separate processing chambers.

The slit valve assembly 300 includes a slit valve opening 302 formed in the sidewalls 304A, 304B, a slit valve door 306 and an actuator 308. The sidewalls 304A, 304B are bound in an interior region of the isolation region 104 in which the slit valve door 306 may be disposed. The slit valve door 306 may be moved by the actuator 308 between a first (closed) position 312 that seals the slit valve opening 302, and a second (open) position 312 that allows the substrate to be transferred through the slit valve opening 302 between the deposition region 102 and the treatment region 106.

Figure 4A:
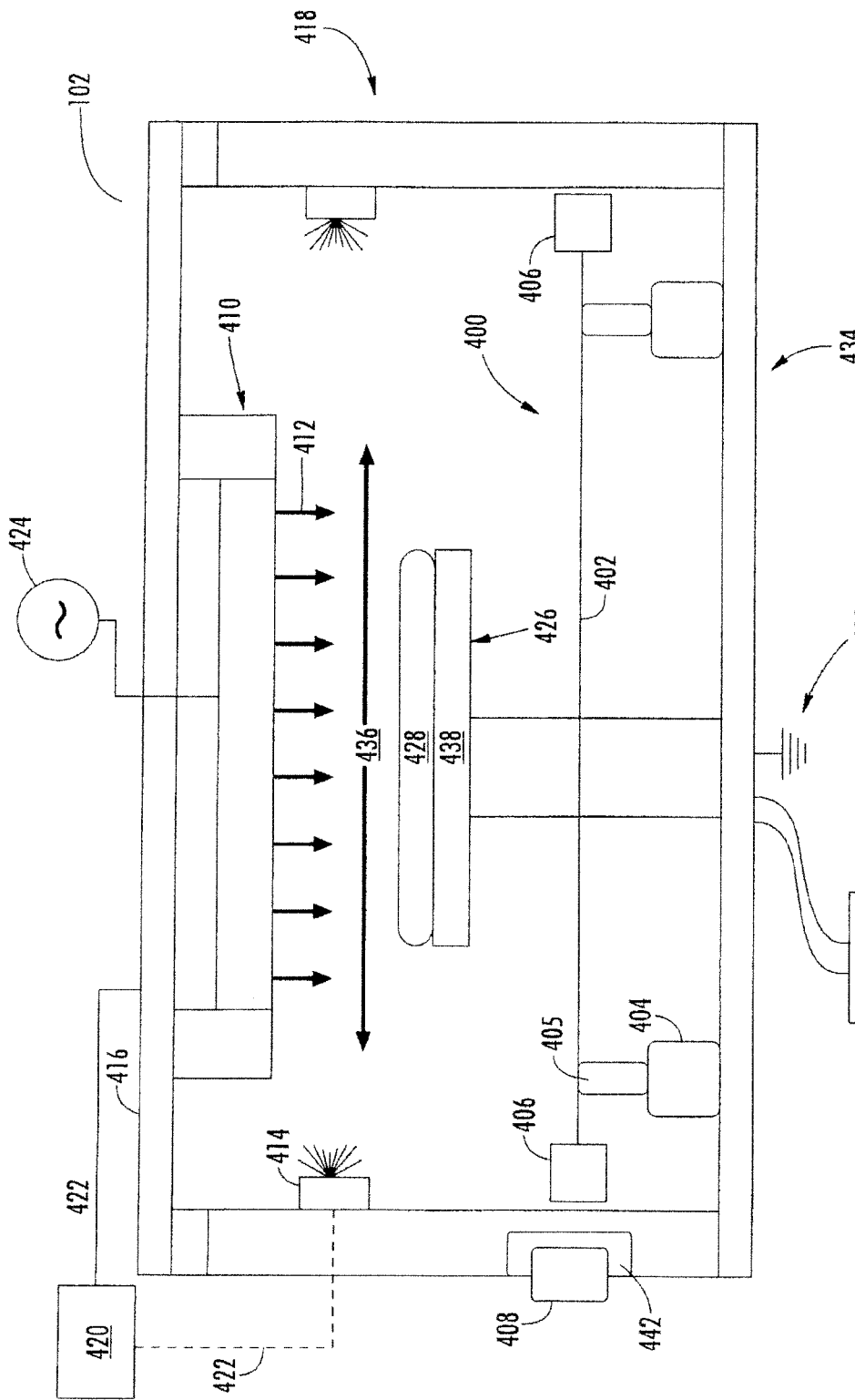
FIG. 4A illustrates a cross-sectional view of a deposition chamber in a processing system.

FIG. 4A provides a cross sectional view of one embodiment of the deposition region 102 having a motion mechanism 400 disposed therein. Although not shown in FIG. 4A, the motion mechanism 400 is similarly present in the isolation region 104 and the treatment region 106 to facilitate transfer of the substrate between the regions 102, 104, 106.

Continuing to refer to FIG. 4A, the deposition chamber includes a lid 416, sidewalls 418, bottom 432, showerhead 410 and substrate support 426. The showerhead 410 is disposed in the interior of the deposition region 102 and coupled to the lid 416. A gas panel 420 is connected to the showerhead 410 by a conduit 422. The gas panel 420 provides process gas to the showerhead 410. The showerhead 410 directs a downward flow 412 of the process gas into a reaction zone 436 defined between the showerhead 410 and the substrate support 426. The showerhead 410 may also be connected to an RF source 424. The RF source 424 provides RF power to the showerhead 410 such that a plasma may be formed from the process gas present in the reaction zone 436.

Optionally, nozzles 414 may be utilized to introduce the process gas into the reaction zone 436 as an alternative to the showerhead 410. The nozzles 414 may be disposed in the interior of the deposition region 102. For example, the nozzles 414 may be coupled to the sidewall 418 and/or lid 416 of the deposition region 102. The gas panel 420 is coupled to each nozzle 414 by a conduit 422.

The substrate support 426 is disposed in the interior of the deposition region 102, and is coupled to the bottom 434 of the deposition region 102. The substrate support 426 further includes a platform 438. An actuator 444 is coupled to the substrate support 426 to raise and/or lower the platform 438. The actuator 444 controls the spacing between a substrate 428 positioned on the substrate support 426 and the showerhead 410. The substrate support 426 is coupled to ground 432.

FIG. 4A further depicts the deposition region 102 at a time when the motion mechanism 400 has delivered the substrate 428 to the deposition region 102. The motion mechanism 400 includes a substrate carrier 402, a guide rail 404, a permanent magnet 406, and a magnetic motor 408. The guide rails 404 are coupled to the bottom 434 of the deposition region 102. The guide rails 404 interact with a guide 405 coupled to the substrate carrier 402. The guide 405 is configured to slide along and/or over guide rails 404. The guide 405 and guide rails 404 allow the substrate carrier 402 to be positioned within the deposition region 102 in a predefined position. The guide 405 and guide rails 404 allow the substrate carrier 402 to move between the other regions 104, 106 or other portion of the processing system 100. The guide 405 and guide rails 404 may be a ball bearing or solid slide, an air or magnetic bearing or other suitable bearing system.

The substrate carrier 402 is configured to carry the substrate 428 through the processing system 100. The permanent magnets 406 are coupled to the lateral ends of the substrate carrier 402 in proximity of the magnetic motor 408. The magnetic motor 408 may be disposed within or outside of the deposition region 102. The magnetic motor 408 may include a plurality of coils. The coils may be sequentially energized to create an alternating magnetic field. The polarity of the magnetic field may be controllably sequenced to urge the permanent magnet 406. Thus, the substrate carrier 402 and substrate thereon is moved to a predefined position within the deposition region 102. The magnetic field also allows the carrier to move between regions 102, 104, 106. In one embodiment, the magnetic motor 408 may be a sawyer motor.

The exterior of the sidewalls 418 of the deposition region 102 may include a bank 442. The magnetic motor 408 may be positioned within the bank 442. In the bank 442, the magnetic motor 408 isolated from the environment within the deposition region 102 by the sidewall 418. The magnetic motor 408 runs the length of the processing system 100 to allow controllable positioning of the substrate carrier 402 within the processing system 100. The controller 112 is utilized to control the sequencing of the polarities of the magnetic motor 408 in response to the position of the substrate carrier 402 within the deposition region 102. Sensors (not shown) are disposed within the processing system 100 to provide positional feedback of the substrate carrier 402 to the controller 112.

Figure 4B:
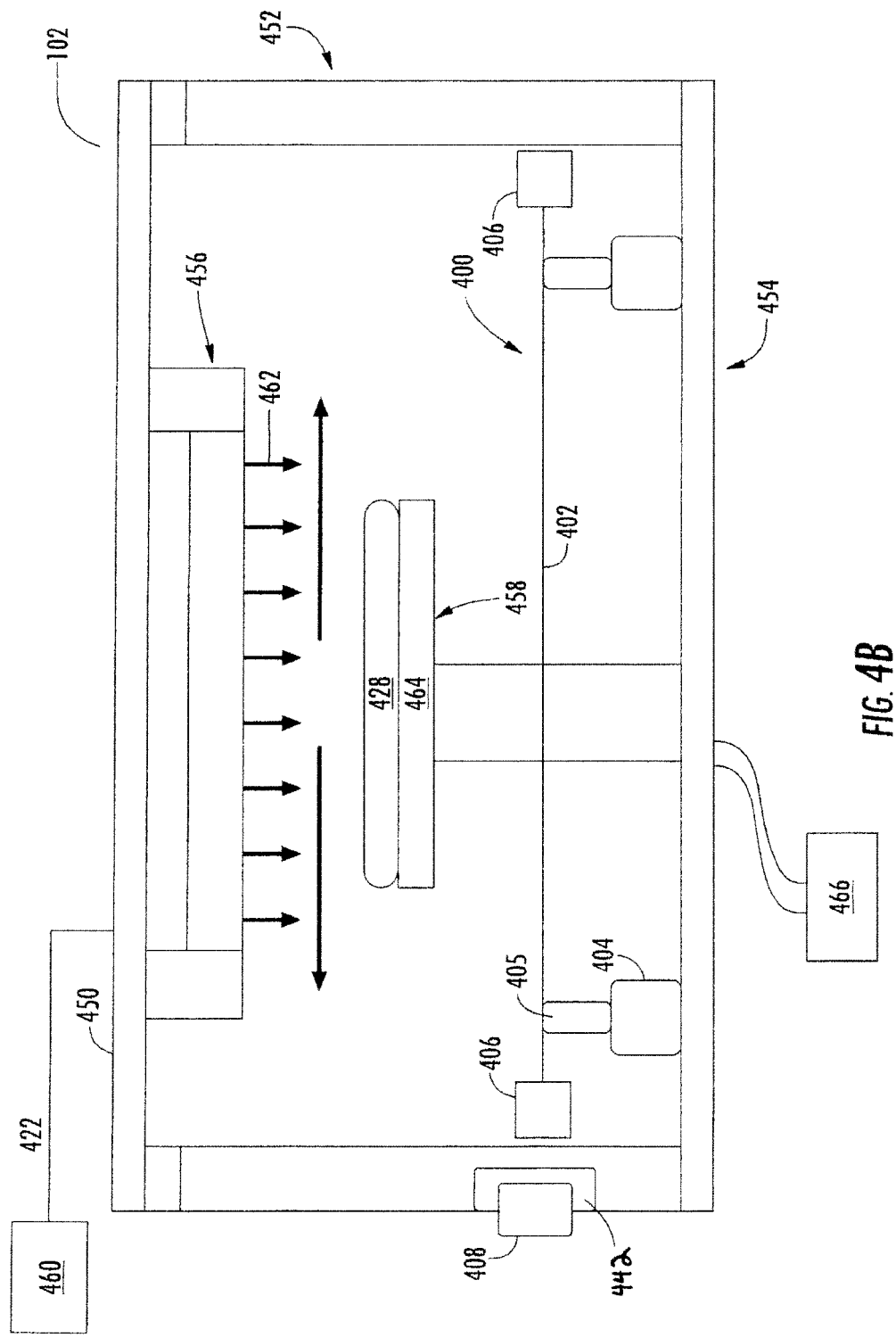
FIG. 4B illustrates a cross-sectional view of a treatment chamber in a processing system.

FIG. 4B provides a cross sectional view of the treatment region 106 illustrating the motion mechanism 400 disposed therein. The treatment region 106 includes a lid 450, sidewalls 452, a bottom 454, a film property altering device 456 and a substrate support 458. The film property altering device 456 is configured to provide energy and/or chemicals to the film deposited in the deposition region 102 while the substrate and substrate carrier 402 are positioned in the treatment region 106. The film property altering device 456 may be disposed in the interior or exterior of the treatment region 106. In at least one embodiment, the film property altering device 456 is coupled to the lid 450.

In some embodiments, a treatment source 460 may be connected to the film property altering device 456 by a conduit 422. The treatment source 460 provides chemical or energy to the film property altering device 456. The energy from the treatment source 460 will direct a downward treatment flow 462 to the substrate 428. The treatment flow 462 is operable to treat the substrate 428 disposed in the treatment region 106 to alter the property of the film deposited in the deposition region 102 shown in FIG. 4A.

The substrate support 458 is disposed in the interior of the treatment region 106. The substrate support 458 is coupled to the bottom 454 of the treatment region 106. The substrate support 458 further includes a platform 464. An actuator 466 is coupled to the substrate support 458 to raise and/or lower the platform 464.

FIG. 4B further depicts the treatment region 106 at a time when the motion mechanism 400 delivers the substrate 428 to the treatment region 106. As described above with reference to FIG. 4A, the motion mechanism 400 includes the substrate carrier 402, the guide rail 404, the permanent magnet 406, and the magnetic motor 408.

The process of moving the substrate 428 into the deposition region 102 and loading the substrate 428 onto the substrate support 426 is provided in more detail in FIGS. 6A-6E.

Figure 5:
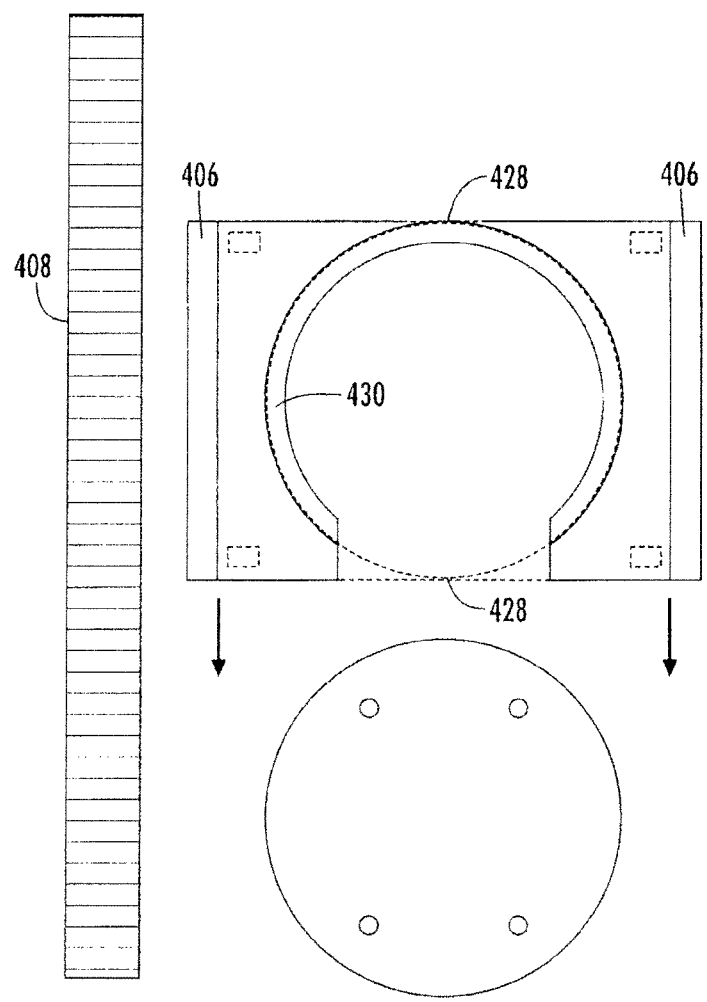
FIG. 5 illustrations a top view of a carrier disposed within a chamber of the processing system.

Referring now to a top view of the substrate carrier 402 illustrated in FIG. 5, the substrate carrier 402 includes the substrate receiving pocket 430, the permanent magnet 406, and the guide 405. The substrate 428 may be supported on top the substrate carrier 402. The motion mechanism 400 is operable to deliver the substrate 428 disposed on the substrate carrier 402 to the deposition region 102. The magnetic motor 400 may also align the substrate carrier 402 and substrate 428 with the platform 438 of the substrate support 426. Lift pins (shown in FIG. 6C) extendable through the substrate support 426. The lift pins are configured to raise the substrate 428 off the substrate carrier 402. The raised substrate 428 allows the substrate carrier 402 to be moved clear of the platform 438 by the motion mechanism 400. The lift pins supporting the substrate 428 retract through the substrate support 426 to position the substrate 428 on the platform 438 of the substrate support 426. The substrate support 426 with substrate 428 positioned thereon may be displaced upwards to place the substrate 428 in a processing position proximate the showerhead 410.

After processing the substrate 428 disposed on the substrate support 426, the substrate support 426 may be lowered away from the showerhead 410 to a transfer position below the plane in which the substrate carrier 402 travels. The lift pins are actuated to space the substrate 428 from the substrate support 426. The space allows for the substrate carrier 402 to be moved between the elevated substrate 428 and the platform of the substrate support 426. The lift pins then retract to place the substrate 428 back onto the substrate carrier 402. The motion mechanism 400 then delivers the substrate 428 disposed on the substrate carrier 402 from the deposition region 102 to the treatment region 106.

Figure 6A:
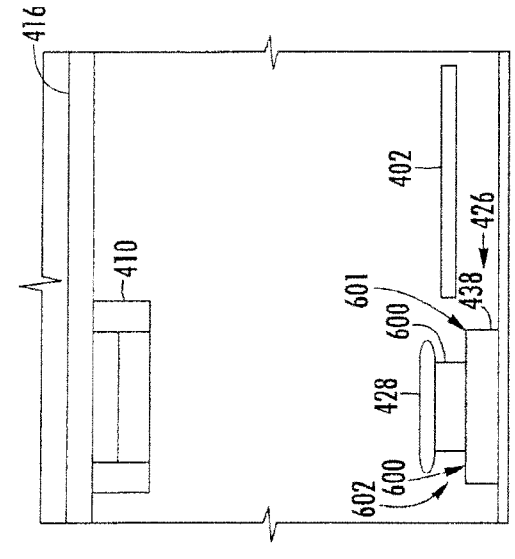
FIGS. 6A-6E illustrates the process of a carrier transferring a substrate to a substrate support within a chamber of a processing system.

FIGS. 6A-6E depict a sequence of the motion mechanism 400 entering deposition region 102, and loading the substrate 428 onto the substrate support 426 for deposition. FIG. 6A depicts the motion mechanism 400 entering the deposition region 102 from the isolation region 104. The substrate support 426 is in a lowered (transfer) position 601. The substrate support 426 in the lowered position 601 allows the substrate carrier 402 to be positioned thereover.

Figure 6B:
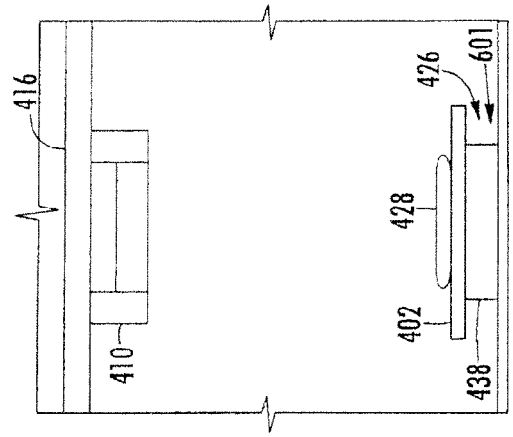

In FIG. 6B, the substrate carrier 402 is aligned above the platform 438 of the substrate support 426. Sensor(s) (not shown) within the deposition region 102 may communicate with the controller (not shown) that controls the operation of the motion mechanism 400 to align the substrate carrier 402 with the platform 438. The controller stops the motion mechanism 400 when the substrate carrier 402 is aligned with the platform 438. The substrate 428 disposed on the substrate carrier 402 is now positioned between the showerhead 410 and the platform 438 of the substrate support 426.

Figure 6C:
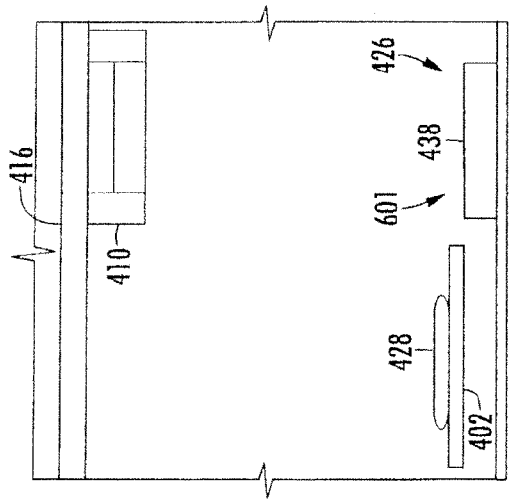

In FIG. 6C, the substrate 428 is removed from the substrate carrier 402. The substrate support 426 further includes lift pins 600. The lift pins 600 are initially in a retracted position, such that the tops of the lift pins 600 are below or flush with the top surface of the platform 438. The controller communicates with the actuator 444 to raise the lift pins 600 when the substrate 428 disposed on the substrate carrier is aligned with the platform 438. The lift pins 600 are extended through the top surface of the substrate support 426. The lift pins 600 then come into contact with the substrate 428 and lift the substrate 428 above the substrate carrier 402. The motion mechanism 400 may move the substrate carrier 402 clear of the platform 438 of the substrate support 426 when the lift pins 600 are in an extended position 602.

Figure 6E:
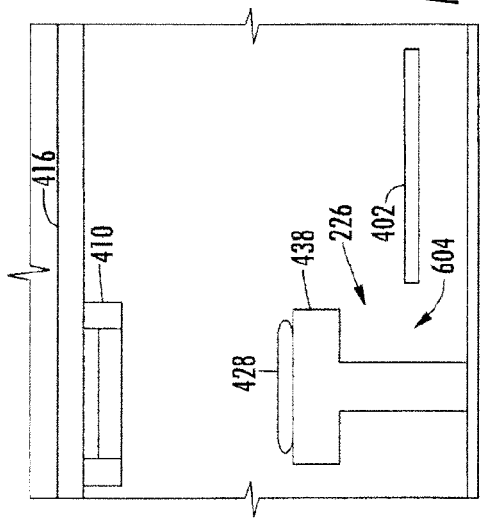
Figure 6D:
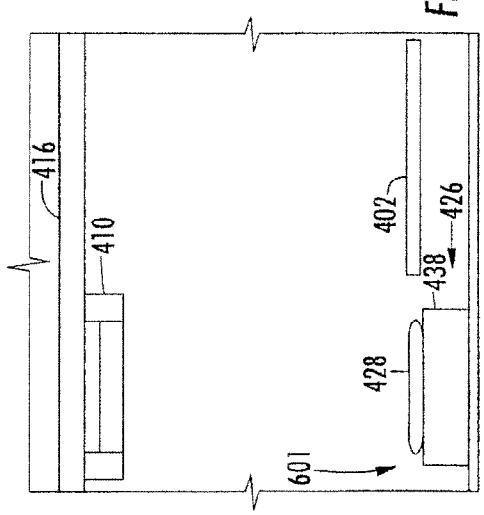

In FIG. 6D, the controller communicates with the actuator 444 to lower the lift pins 600 when the motion mechanism 400 moves the substrate carrier 402 beyond the platform 438 of the substrate support 426. The substrate 428 is set on the platform 438 of the substrate support 426 when the lift pins 600 are retracted back through the substrate support 426. The substrate support 426 may then raise the substrate 428 to a processing position proximate the showerhead. The substrate carrier 402 remains clear of the platform 438 until the deposition process is complete.

In FIG. 6E, the deposition process in the deposition region 102 begins. The sensor(s) communicates with the controller when the substrate 428 is secured on the platform 438. The controller then communicates with the actuator (not shown) to raise the platform 438 of the substrate support 426 towards the showerhead 410. Deposition may begin once the platform 438 is in a raised position 604 placing the substrate 428 proximate the showerhead 410.

The sequence of FIGS. 6A-6E is performed in reverse, once the deposition process is completed, to return the substrate 428 back to the substrate carrier 402. The motion mechanism 400 may move the substrate carrier 402 having the substrate 428 disposed thereon through the isolation region 104 and into either another deposition region 102 or treatment region 106 when the substrate 428 is supported on the substrate carrier 402 and the substrate support 426 is clear below the substrate carrier 402.

Figure 7:
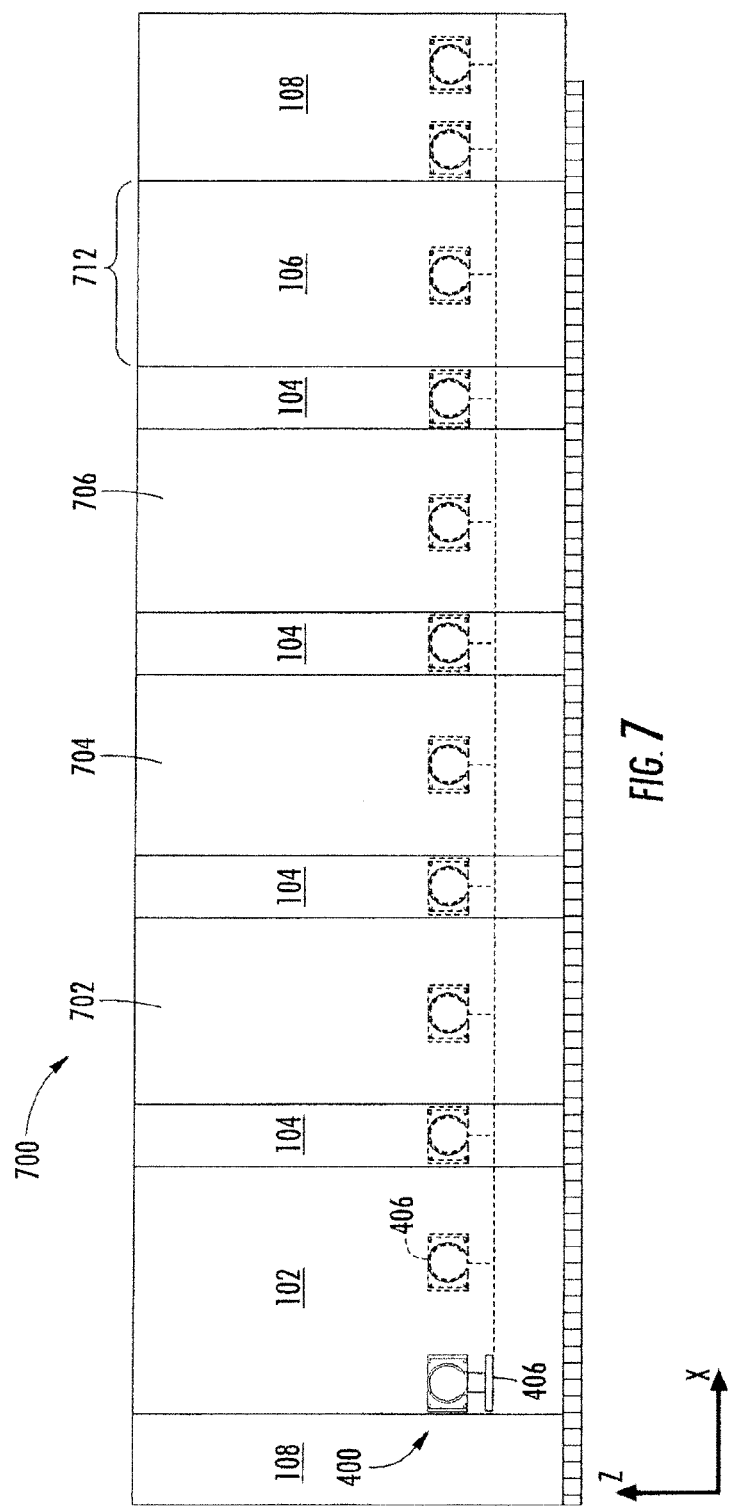
FIG. 7 illustrates a layout of a linear processing system.

FIG. 7 illustrates a top view of one configuration of a linear processing system 700. The linear processing system 700 includes a load lock station 108, a deposition region 102, an isolation region 104, a treatment region 106, alternate chambers 702, 704, 706, and a motion mechanism 400. The load lock station 108, the deposition region 102, isolation region 104, the treatment region 106 and the alternate chambers 702, 704, 706 are linearly coupled in an X-Z coordinate system.

The load lock station 108, the deposition region 102, the treatment region 106, and the alternate chambers 702, 704, 706 are collectively referred to as a vacuum tight, linear processing platform 712. The isolation region 104 separates any two adjacent linear processing regions 102, 106.

The motion mechanism 400 includes a substrate carrier 402, permanent magnet 406 and magnetic motor 408. The motion mechanism 400 may move a substrate carrier 402 from the load lock station 108, through the isolation region 104, and into the deposition region 102. The magnetic motor 408 is utilized to generate a force on the permanent magnet 406 coupled to the substrate carrier 402, thus urging the substrate carrier 402 to move within the linear processing system 700.

The deposition region 102 may be any one of a chemical vapor deposition (CVD) chamber, a spin-on coating chamber, a flowable (CVD) chamber, a physical vapor deposition (PVD) chamber, atomic vapor deposition (ALD) chamber, epitaxial deposition chamber, or other deposition chamber suitable for depositing thin films.

The treatment region 106 may be any one of thermal treatment chamber, an annealing chamber, a rapid thermal anneal chamber, a laser treatment chamber, an electron beam treatment chamber, a UV treatment chamber, an ion beam implantation chamber, an ion immersion implantation chamber, or other treatment chamber capable of altering the properties of the deposited film.

The alternate chambers 702, 704, 706 may be additional deposition regions 102, additional treatment regions 106, or a combination of additional deposition regions 102 and treatment regions 106. Additionally, any one or all of the alternate chambers 702, 704, 706 may be omitted from the processing system 100.

Figure 8:
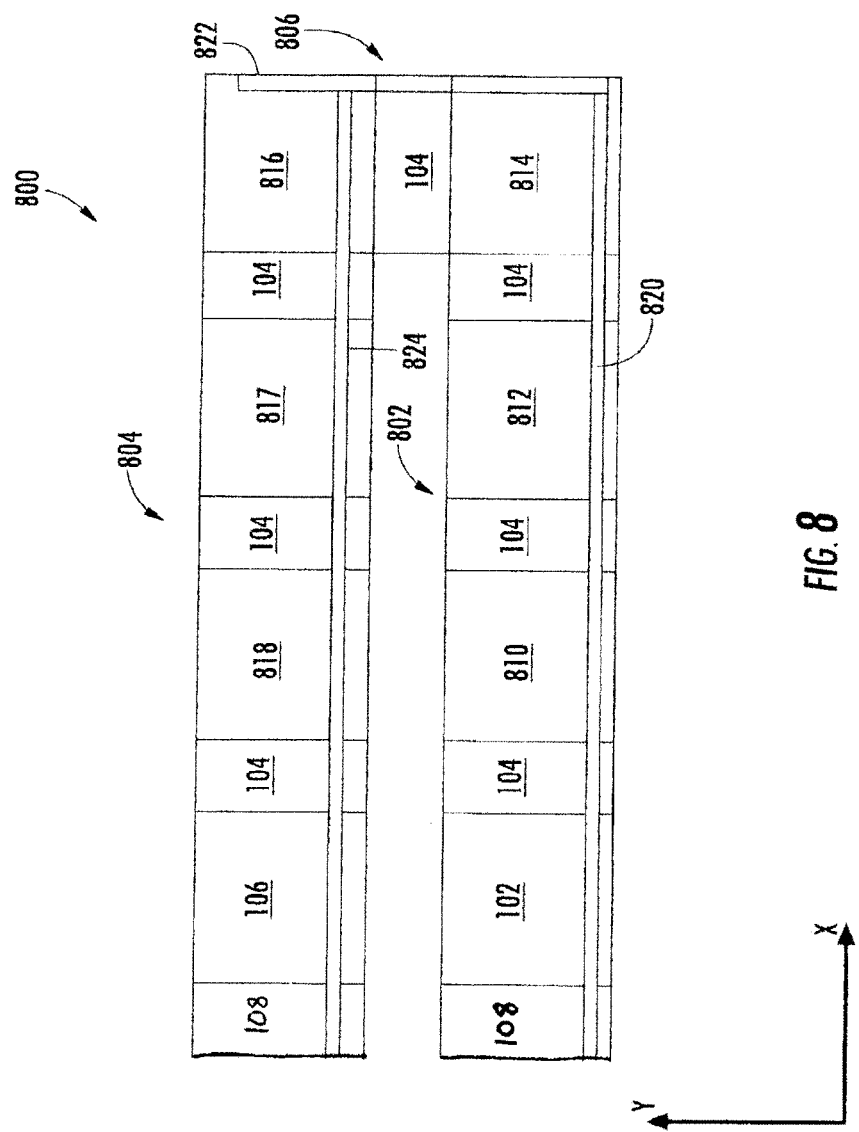
FIG. 8 illustrates a layout of a vertical processing system.

FIG. 8 illustrates a side view of another embodiment of an inline processing system 800. The inline processing system 800 includes a first linear processing section 802 coupled to a second linear processing section 804. The direction of travel of a substrate within each of the sections 802, 804 are not co-linear. For example, a substrate may travel through the first linear processing section 802 in a positive y-direction of an X-Y coordinate system, while the substrate travel through the second linear processing section 804 may be in a negative y-direction. The sections 802, 804 may be connected by a coupling section 806.

The first linear processing section 802 includes a load lock station 108, an isolation region 104, a deposition region 102, optional alternate chambers 810, 812, 814, a treatment region 106, and a first magnetic motor 820. The isolation region 104 separates at least the deposition region 102 from the treatment region 106. The first magnetic motor 820 runs along the length of the first linear processing section 802. The motion mechanism (not shown in FIG. 8) uses the first magnetic motor 820 to move the substrate within the first linear processing section 802. The alternate chambers 810, 812, 814 may be either another deposition region 102 or treatment region 106. Additionally, any one or all of the alternate chambers 810, 812, 814 may be omitted from the first linear processing section 802.

The second linear processing section 804 may include one or more of a load lock station 108, an optional deposition region 102, an isolation region 104, a treatment region 106, an optional alternate chambers 816, 817, 818, and a second magnetic motor 824. The isolation region 104 separates at least the treatment region 106 from the deposition region 102. The second magnetic motor 824 runs along the length of the second linear processing section 804. The motion mechanism (not shown) uses the second magnetic motor 824 to move the substrate disposed on a substrate carrier along the length of the second linear processing section 804. The alternate chambers 816, 817, 818 may be either a deposition region 102 or treatment region 106. Additionally, any one or all of the alternate chambers 816, 817, 818 may be omitted from the second linear processing section 804.

The coupling section 806 connects the first linear processing section 802 to the second linear processing section 804. A third magnetic motor 822 is integrated with the coupling section 806 to move the substrate disposed on the substrate carrier from the first linear processing section 802 to the second linear processing section 804. The isolation region 104 may also separate the first linear processing section 802 and the second linear processing section 804. The third magnetic motor 822 runs along the coupling section 806. The motion mechanism (not shown) uses the magnetic motor 822 to move the substrate and substrate carrier along the coupling section 806 in order to position the substrate within the system.

Figure 9A:
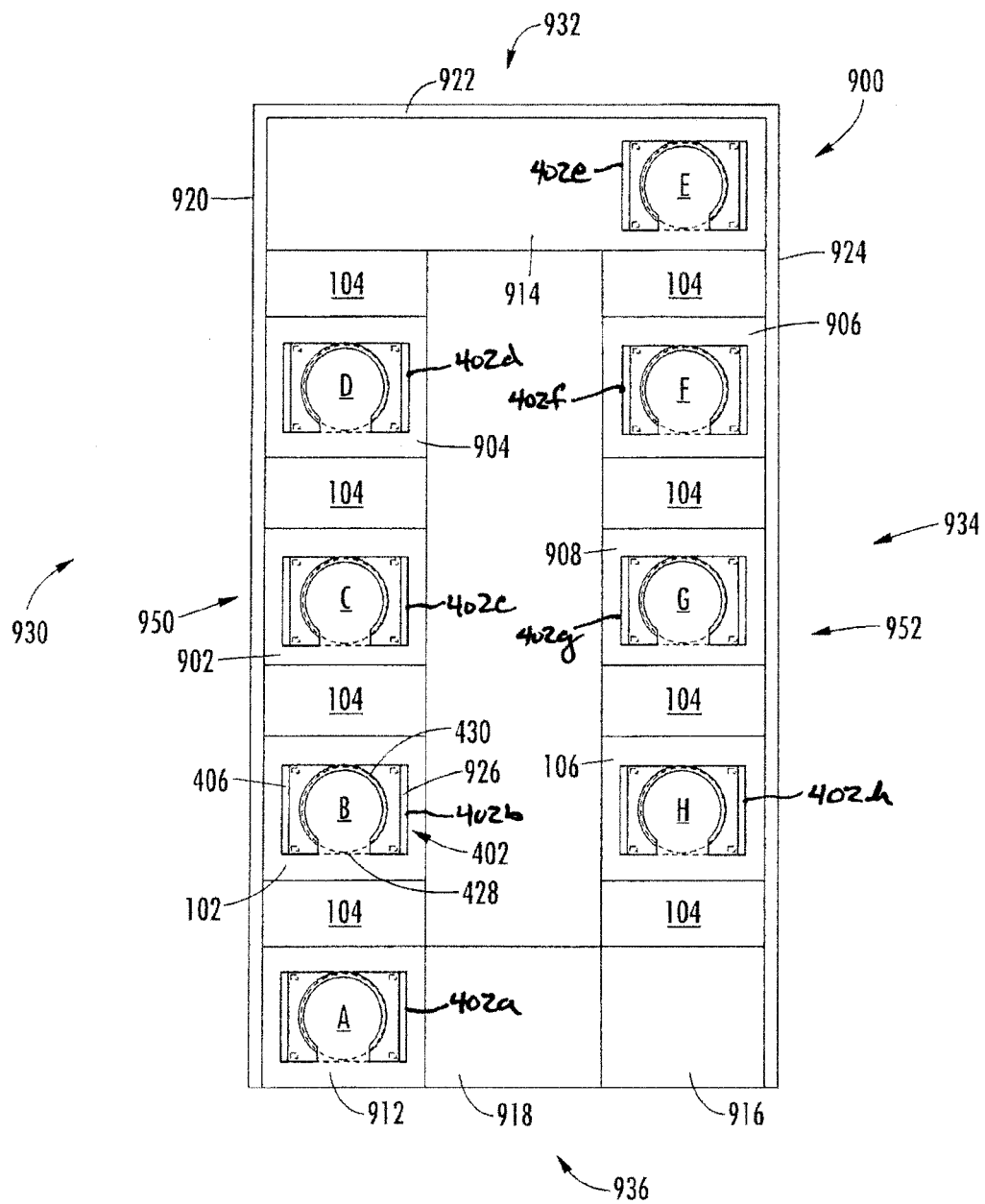
FIGS. 9A-9C illustrates a sequence for a racetrack processing system.
Figure 9B:
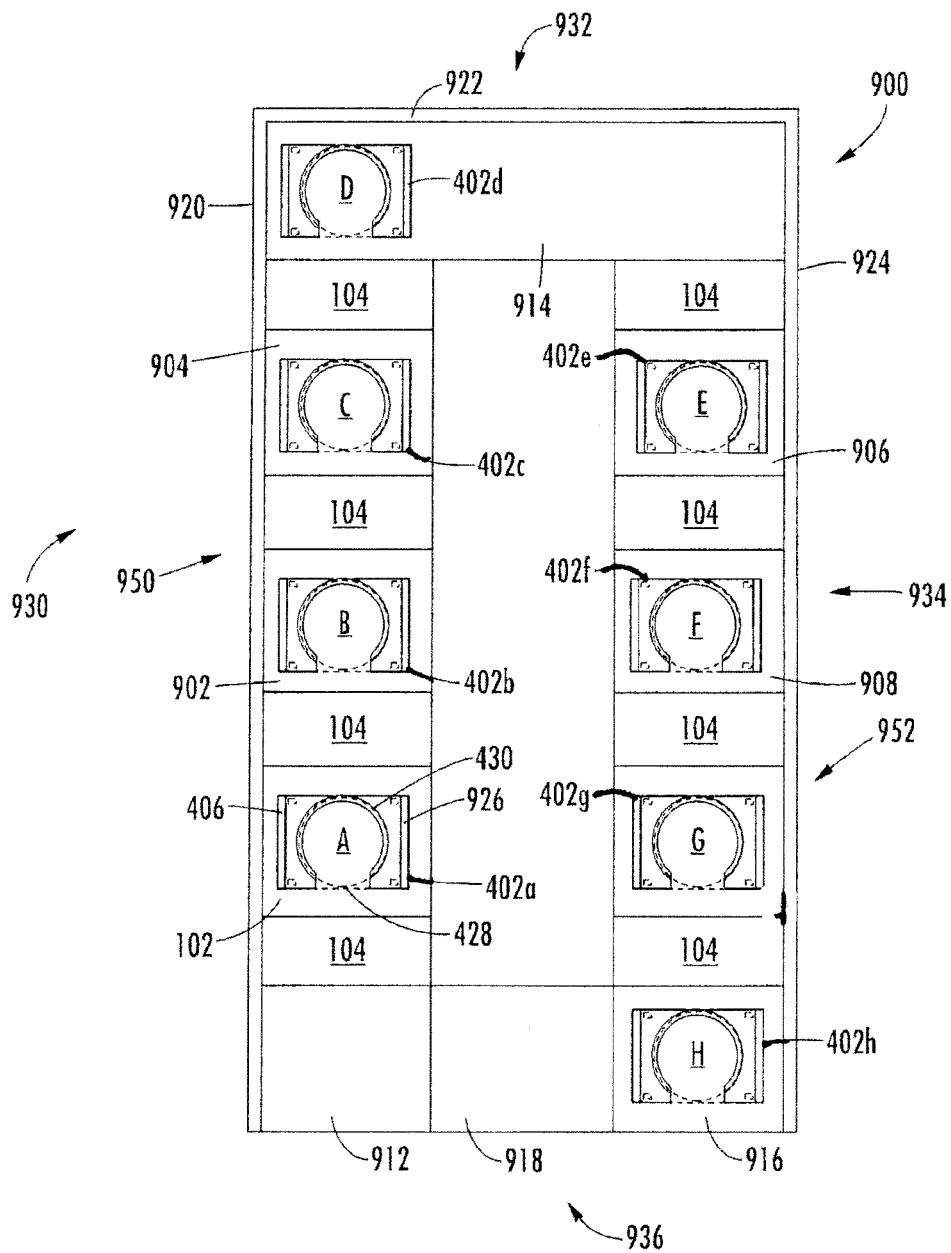
Figure 9C:
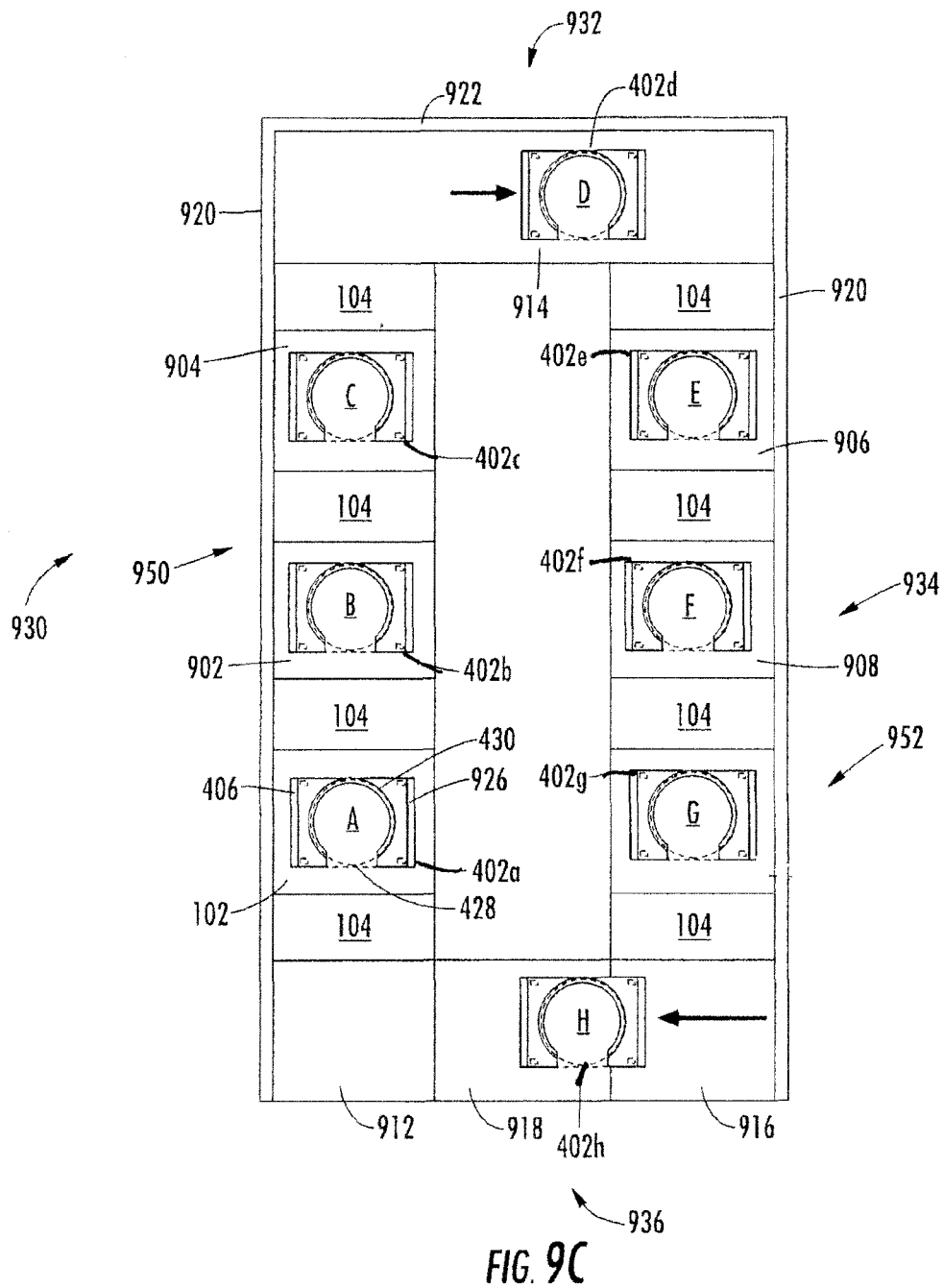

FIGS. 9A-9C illustrate a top view of a racetrack processing system 900. The racetrack processing system 900 includes a first section 930, a second section 932, a third section 934, and a fourth section 936. The first section 930, second section 932, third section 934 and fourth section 936 are coupled together to form a rectangular racetrack.

In one embodiment, the first section 930 includes a load lock station 912, an isolation region 104, a deposition region 102, optional alternate chambers 902, 904, a via 920, an optional treatment region 106, and a first magnetic motor 920. The isolation region 104 separates at least the regions 102, 106. The isolation region 104 also allows for the deposition region 102 to be in fluid communication with the treatment region 106. The isolation region 104 may be a gas curtain (as depicted in FIG. 2) or a slit valve (as depicted in FIG. 3).

The first magnetic motor 920 runs along the length of the first section 930, for example along an outer side 950. The first magnetic motor 920 positions the substrate carrier 402 along the length of the first section 930. The permanent magnet 406 coupled to the substrate carrier 402, engages with the first magnetic motor 920 to move the substrate carrier 402 within the first section 930. The alternate chambers 902, 904 may be either a deposition region 102 or treatment region 106. Additionally, any one or all of the alternate chambers 902, 904 may be omitted from the first section 930. The via 914 is the last section (with respect to the load lock station 912) in the first section 930. The via 914 fluidly communicates with the second section 932, and couples the first section 930 to the second section 932.

The second section 932 further includes a first via 914 and a second magnetic motor 922. The first via 914 couples the first section 930 to the third section 934, and allows for the substrate carrier 402 to move from the first section 930 to the third section 934 of the racetrack processing system 900. The second magnetic motor 922 runs along the length of the second section 932, for example along an outer perimeter. The substrate carrier 402 uses the second magnetic motor 922 to move along the length of the second section 932. The permanent magnet 406 and the permanent magnet 926 engage with the second magnetic motor 922 to move the substrate carrier 402 within the second section 932.

The third section 934 includes a load lock station 916, an optional deposition region 102, an isolation region 104, a treatment region 106, optional alternate chamber 906, 908, and the first via 914. The isolation region 104 separates the regions 102, 106. The isolation region 104 separates the treatment region 106 from the deposition region 102. The isolation region 104 may be a gas curtain (as depicted in FIG. 2) or a slit valve (as depicted in FIG. 3).

The third magnetic motor 924 runs along the length of the third section 934, for example, along an outer perimeter 952. The substrate carrier 402 uses the third magnetic motor 924 to move along the length of the third section 934. The second permanent magnet 926 engages with the third magnetic motor 924 to move the substrate carrier 402 within the third section 934. The alternate chambers 906, 908 may be either a deposition region 102 or treatment region 106. Additionally, any one or all of the alternate chambers 906, 908 may be omitted from the third section 934.

The fourth section 936 includes the load lock stations 912, 916 and a second via 918. The second via 918 couples the first section 930 to the third section 934. The via 918 allows for a substrate 428 to either leave the racetrack processing system 900 or, alternatively, return through the racetrack processing system 900 one or more additional times.

FIG. 9A represents racetrack processing system 900 when two substrate carriers 402a, 402e are waiting to enter a chamber, and six chambers are processing the substrate carriers 402b, 402c, 402d, 402f, 402g, 402h. When the six chambers are processing, the isolation region 104 will not allow any chamber to be in fluid communication with another chamber.

FIG. 9B represents the racetrack processing system 900 after the six chambers are finished processing, and substrate carriers 402 have moved one station forward. Once the six chambers are finished processing, the isolation region 104 allows each chamber to be in fluid communication with an adjacent chamber. Each substrate carrier 402 may move one station forward. Substrate carriers 402e, 402f, 402g, 402h move by using the magnetic coupling between permanent magnet 926 and third magnetic motor 924. Substrate carriers 402a, 402b, 402c, 402d move by using the magnetic coupling between permanent magnet 406 and the first magnetic motor 920. Additionally, substrate carrier 402d will move across the via 914 by using the magnetic coupling between permanent magnets 406, 926.

In FIG. 9C, the pump system 120 begins to pump down the racetrack processing system 900. The isolation regions 104 are once again closed, as the chambers are ready to begin process. The substrate carrier 402h may either unload the substrate 428 through the load lock station 916, or the substrate carrier 402h may pass through the second via 918 and wait in the load lock station 912 to enter the racetrack processing system 900 once more. The substrate carrier 402e uses the magnetic coupling between the second magnetic motor 922 and the permanent magnets 406, 926 to move across the second section 932. The process depicted in FIGS. 9A-9C repeats as many times as desired by the user.

Figure 10:
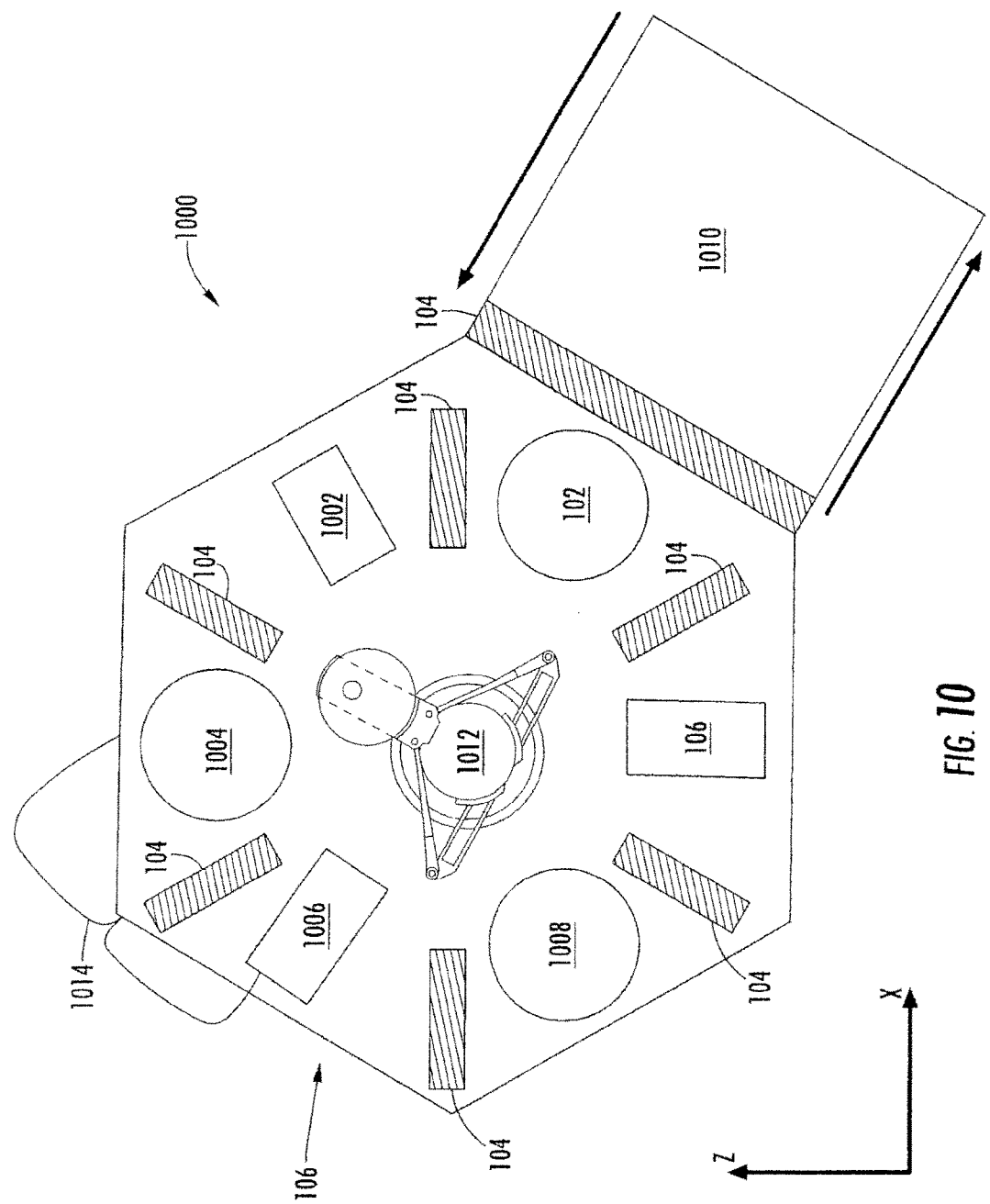
FIG. 10 illustrates a layout of a carousel processing system.

FIG. 10 illustrates a top view for another embodiment of the processing system 100. The layout depicted in FIG. 10 is a carousel processing system 1000. The carousel processing system 1000 includes a load lock station 1010 and a carousel processing section 1014.

The load lock station 1010 allows for a substrate (not shown) to enter the carousel processing section 1014. Once the substrate is finished processing, the substrate leaves the carousel processing section 1014 through the same load lock station 1010.

The carousel processing section 1014 further includes a deposition region 102, an isolation region 104, a treatment region 106, optional alternate chambers 1004, 1006, 1008, and a robot 1012. The isolation region 104 separates at least the regions 102, 106. The robot 1012 moves the substrate among the carousel stations 1016. The alternate chambers 1002, 1004, 1006 may be either a deposition region 102 or a treatment region 106. Additionally, any one or all of the alternate chambers 1002, 1004, 1006 may be omitted from the carousel processing section 1014.

Figure 11A:
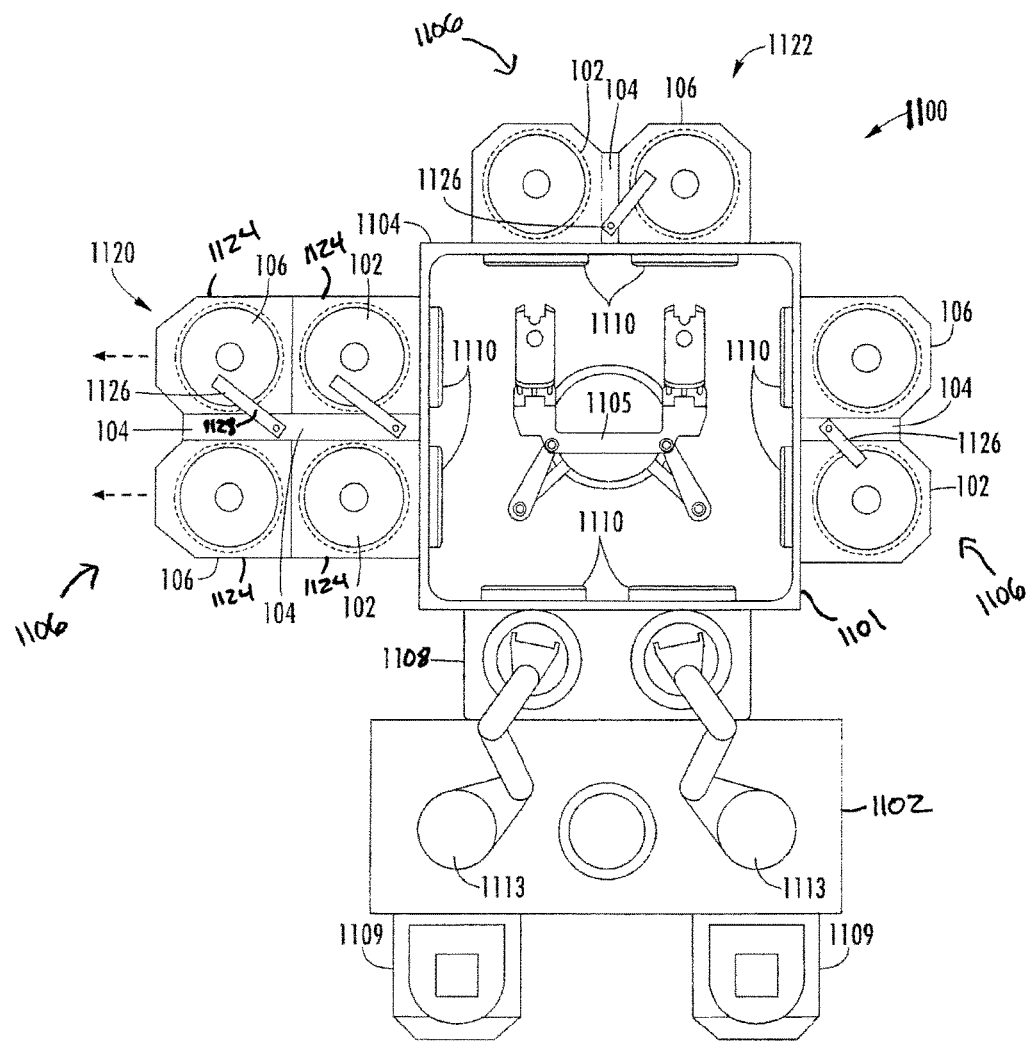
FIG. 11A illustrates a top view of a semiconductor tandem processing system.

FIG. 11A illustrates a top view of a semiconductor tandem processing system 1100. The system 1100 is generally a self-contained system having the necessary processing utilities supported on a mainframe structure 1101 that can be easily installed and provides a quick start up for operation. System 1100 generally includes four different regions: a front-end staging area 1102, a load lock station 1108, and a transfer chamber 1104 in communication with a plurality of processing stations 1106 through isolation valves 1110. The processing stations 1106 may be single substrate, tandem substrate, or other multi-substrate processing region. A tandem substrate processing station 1106 is shown in FIG. 11A. Front-end staging area 1102, which is generally known as a factory interface, generally include an enclosure having at least one substrate containing cassette 1109 positioned in communication therewith via a pod loader, for example. The system 1100 may also include a pair of front-end substrate transfer robots 1113, which may generally be single-arm robots configured to move substrates between the front-end staging area 1102 and the load lock station 1108. The pair of front-end substrate robots 1113 are generally positioned proximate cassettes 1109 and are configured to remove substrates for processing, as well as position substrates therein once processing of the substrates is complete. Although two cassettes 1109 are shown, an embodiment of the invention contemplates using a stackable substrate cassette feeder assembly (not shown). The stackable substrate cassette feeder assembly may be configured to store a plurality of cassettes 1109 in a vertical stack and individually deliver the cassettes 1109 to outer cassette locations/pod loaders when needed. The front-end staging area 1102 is selectively in communication with the load lock station 1108 to allow transfer of substrates through, for example, a selectively actuated slit valve (not shown). Additionally, load lock station 1108 may also be selectively in communication with the transfer chamber 1104 via another selectively actuated slit valve, for example. The load lock station 108 isolates the interior of the substrate transfer chamber 1104 from the interior of the front-end staging area 1102 during the process of transferring one or more substrates into the transfer chamber 1104 for processing. The load lock station 1108 may be a side-by-side substrate type chamber, a single substrate type chamber, or multi-substrate-type load lock chamber, for example, as is generally known in the art.

As illustrated in FIG. 11A, a substrate transfer robot 1105 may be centrally positioned in the interior portion of the transfer chamber 1104. The substrate transfer robot 1105 is generally configured to retrieve substrates from the load lock station 1108 and transport the substrates to one of the processing stations 1106 positioned about the perimeter of the transfer chamber 1104. Additionally, the substrate transfer robot 1105 is generally configured to transport substrates between the respective tandem processing stations 1106, as well as from other processing stations 1106, and back into the load lock station 1108. The substrate transfer robot 1105 generally includes a single dual-blade configured to support two substrates simultaneously thereon. The blade may include two support surfaces generally aligned in a single plane to hold the substrates thereon. Additionally, the blade of the substrate transfer robot 1105 is selectively extendable, while the base is rotatable, which allows the blade access to the interior portion of any of the processing station 1106, load lock station 1108, and/or any other station positioned around the perimeter of the transfer chamber 1104.

Figure 11B:
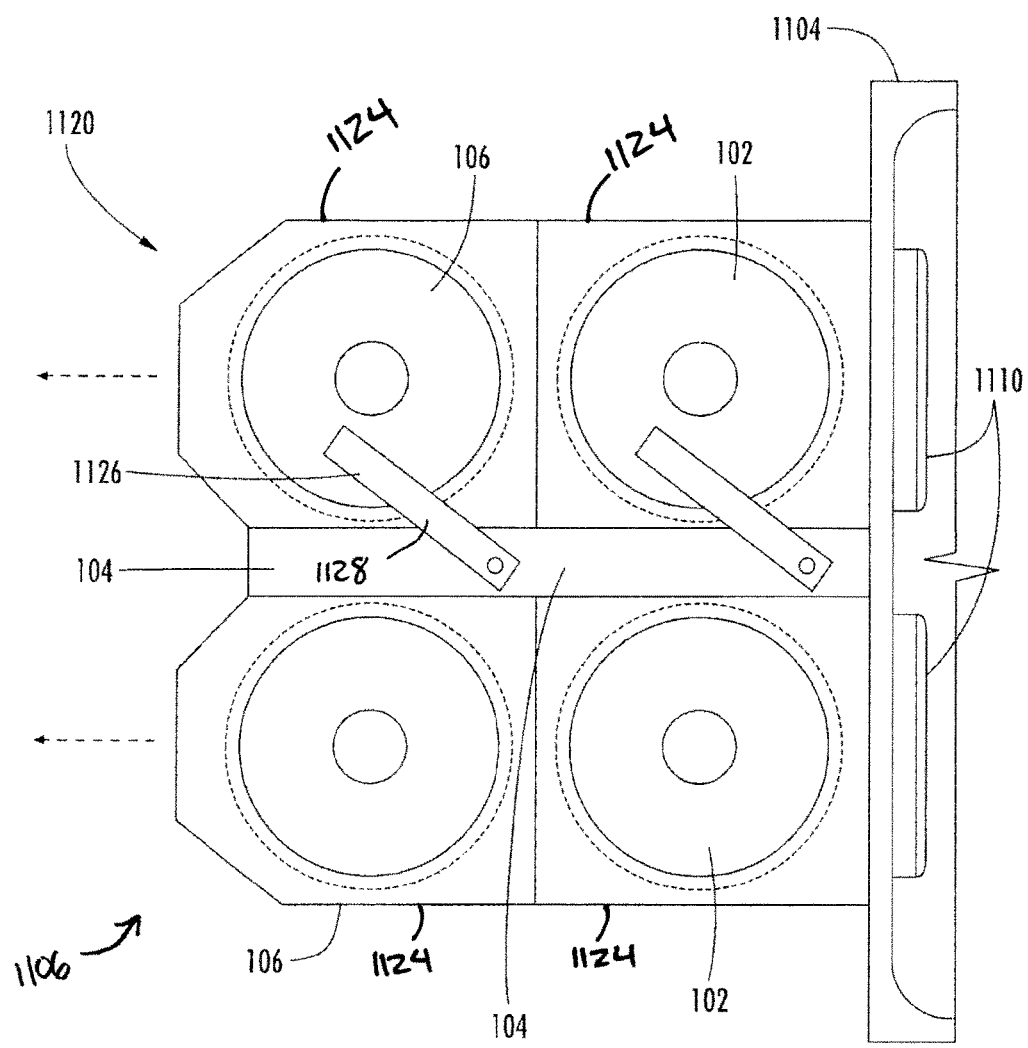
FIG. 11B illustrates an enlarged view of a quad processing station in the semiconductor tandem processing system.

FIG. 11B is an enlarged view of one embodiment of the processing station 1106 configured to simultaneously process a plurality of substrates. In the embodiment depicted in FIG. 11B, the processing station 1106 is illustrated as a quad processing station 1120. The quad processing station 1120 includes four chambers 1124. The chambers 1124 may include, for example, one or more deposition regions 102 and/or one or more treatment regions 106. Each chamber 1124 is separated from an adjacent chamber 1124 by an isolation region 104. The isolation region 104 may be a slit valve or a gas curtain as previously described. The isolation region 104 further includes a motion mechanism 1126. The motion mechanism 1126 moves a substrate between chambers 1124, such as, for example, from the deposition region 102 to the treatment region 106. The motion mechanism 1126 may be a magnetically levitated motion mechanism, and includes a blade 1128, a puck (not shown), and a magnetic coil (not shown). The magnetic coil is positioned in the isolation region 104. The blade 1128 is attached to the levitating puck, which is levitated by the magnetic coil. The motion mechanism 1126 is configured to move the substrate between substrate supports disposed in each of the chambers 1124. Alternatively, there may be more than motion mechanism 1126, such that one blade 1128 can pass the substrate to another blade 1128 or between designated pairs of substrate supports. The quad processing station 1106 may be extended to include more than four processing chambers.

Referring back to FIG. 11A, the dual processing station 1122 includes a deposition region 102, an isolation region 104, and a treatment region 106. The isolation region 104 separates the deposition region 102 from the treatment region 106. The isolation region 104 further includes a motion mechanism 1126, as described above, and is operable to move the substrate between the deposition region 102 and the treatment region 106.

What is claimed is:
1. A processing system, comprising:
   a deposition chamber, wherein the deposition chamber is configured to deposit a film on a substrate, the deposition chamber comprising:
   a first substrate support configurable between a lowered position and a raised position, the first substrate support having a first substrate receiving surface configured to support the substrate during processing;
a treatment chamber, wherein the treatment chamber is arranged to receive substrates from the deposition chamber and pass substrates away from the deposition chamber, the treatment chamber further comprising:
a second substrate support configurable between a lowered position and a raised position, the second substrate support having a second substrate receiving surface configured to support the substrate during treatment; and
a film property altering device, which comprises a showerhead, that is operable to treat the substrate disposed in the treatment chamber to alter a property of the film deposited in the deposition chamber;
at least one isolation region is positioned to separate the deposition chamber from the treatment chamber, the isolation region disposed in-line between the deposition chamber and the treatment chamber; and
a motion mechanism configured to move the substrate from the deposition chamber to the treatment chamber along a guide rail disposed therebetween, the motion mechanism comprising:
a substrate carrier having a substrate receiving pocket formed therein, the substrate receiving pocket defined by an arcuate opening and a slot in the substrate carrier, wherein lift pins are configured to extend through the arcuate opening to position the substrate on the first substrate receiving surface of the first substrate support, and wherein the lift pins are configured to pass through the slot so the substrate carrier is laterally movable relative to the lift pins when the lift pins are extended.

2. The processing system of claim 1, wherein the motion mechanism further comprises a magnetic motor disposed outside of the deposition chamber.

3. The processing system of claim 2, wherein the deposition chamber is selected from the group consisting of a chemical vapor deposition (CVD) chamber, a spin-on coating chamber, a flowable (CVD) chamber, a physical vapor deposition (PVD) chamber, an atomic vapor deposition (ALD) chamber, and an epitaxial deposition chamber.

4. The processing system of claim 3, wherein the treatment chamber is selected from the group consisting of a thermal treatment chamber, an annealing chamber, a rapid thermal anneal chamber, a laser treatment chamber, an electron beam treatment chamber, a UV treatment chamber, an ion beam implantation chamber, and an ion immersion implantation chamber.

5. The processing system of claim 4, wherein the isolation region comprises:
a gas curtain.

6. The processing system of claim 4, wherein the isolation region comprises:
a slit valve.

7. The processing system of claim 4, further comprising:
a load lock station, the deposition chamber disposed between the load lock station and the treatment chamber.

8. The processing system of claim 1, further comprising:
a second treatment chamber downstream of the deposition chamber; and
a second isolation region configured to separate the second treatment chamber from the treatment chamber, the second isolation region directly coupled to both the treatment chamber and the second treatment chamber.

9. The processing system of claim 1, further comprising:
a second deposition chamber upstream of the treatment chamber; and
a second isolation region configured to separate the second deposition chamber from the deposition chamber, the second isolation region directly coupled to both the second deposition chamber and the deposition chamber.

10. A processing system, comprising:
a deposition chamber configured to deposit a film on a substrate, the deposition chamber further comprising:
a first substrate support configurable between a lowered position and a raised position, the first substrate support configured to support the substrate in an interior volume of the deposition chamber for processing;
a treatment chamber, wherein the treatment chamber is connected in-line with the deposition chamber, the treatment chamber further comprising:
a second substrate support configurable between a lowered position and a raised position, the second substrate support configured to support a substrate in an interior volume of the treatment chamber for processing; and
a film property altering device, which comprises a showerhead, that is operable to treat the substrate disposed in the treatment chamber to alter a property of a film deposited on the substrate in the deposition chamber, the film property altering device disposed in the interior volume of the treatment chamber, substantially parallel to and above the top surface of the substrate support in the interior volume;
at least one isolation region is positioned to separate the deposition chamber from the treatment chamber, the isolation region disposed in-line between the deposition chamber and the treatment chamber; and
a transfer mechanism configured to transfer a substrate from the deposition chamber, through the isolation region, and into the treatment chamber along a guiderail disposed therebetween, the transfer mechanism comprising:
a substrate carrier having a substrate receiving pocket formed therein, the substrate receiving pocket defined by an arcuate opening and a slot in the substrate carrier, wherein lift pins are configured to extend through the arcuate opening to position the substrate on the first substrate support of the deposition chamber, and wherein the lift pins are configured to pass through the slot so the substrate carrier is laterally movable relative to the lift pins when the lift pins are extended;
the deposition chamber, treatment chamber, isolation region, and transfer mechanism residing in a vacuum tight processing system.

11. The processing system of claim 10, wherein the deposition chamber is selected from the group consisting of a chemical vapor deposition (CVD) chamber, a spin-on coating chamber, a flowable (CVD) chamber, a physical vapor deposition (PVD) chamber, an atomic vapor deposition (ALD) chamber, and an epitaxial deposition chamber.

12. The processing system of claim 11, wherein the treatment chamber is selected from the group consisting of a thermal treatment chamber, an annealing chamber, a rapid thermal anneal chamber, a laser treatment chamber, an electron beam treatment chamber, a UV treatment chamber, an ion beam implantation chamber, and an ion immersion implantation chamber.

13. The processing system of claim 10, further comprising:
a second treatment chamber downstream of the deposition chamber; and
a second isolation region configured to separate the second treatment chamber from the treatment chamber, the second isolation region directly coupled to both the treatment chamber and the second treatment chamber.

14. The processing system of claim 10 further comprising:
a second deposition chamber upstream of the treatment chamber; and
a second isolation region configured to separate the second deposition chamber from the deposition chamber, the second isolation region directly coupled to both the second deposition chamber and the deposition chamber.

15. A method for processing a substrate in a processing system, the method comprising:
transferring a substrate into a first deposition chamber;
depositing a film on the substrate while in the first deposition chamber;
transferring the substrate through a first isolation region separating the first deposition chamber from a first treatment chamber, wherein the substrate is transferred from the first deposition chamber to the first treatment chamber by a motion mechanism along a guide rail disposed therebetween, the motion mechanism comprising a substrate carrier having a substrate receiving pocket formed therein, the substrate receiving pocket defined by an arcuate opening and a slot in the substrate carrier, wherein lift pins are configured to extend through the arcuate opening to position the substrate on a first substrate receiving surface of a first substrate support of the first deposition chamber, and wherein the lift pins are configured to pass through the slot so the substrate carrier is laterally movable relative to the lift pins when the lift pins are extended; and
altering a property of the deposited film in the first treatment chamber.

16. The method of claim 15, further comprising:
processing simultaneously substrates in the first deposition chamber and the first treatment chamber.

17. The method of claim 16, further comprising:
transferring the substrate from a load lock station to the first deposition chamber; and
transferring the substrate from the first treatment chamber to the load lock station without passing through the first deposition chamber.

18. The method of claim 15, further comprising:
transferring the substrate from the first deposition chamber to a second deposition chamber through a second isolation region separating the first deposition chamber from the second deposition chamber.

19. The method of claim 15, further comprising:
transferring the substrate from the first treatment chamber to a second treatment chamber through a second isolation region separating the first and second treatment chambers.

20. The method of claim 15, further comprising:
transferring the substrate from the first treatment chamber to a second deposition chamber through a second isolation region separating the first treatment chamber from the second deposition chamber.

* * * * *